US012564050B2

(12) United States Patent
Becks et al.

(10) Patent No.: US 12,564,050 B2
(45) Date of Patent: Feb. 24, 2026

(54) THERMAL SUBSTRATES

(71) Applicant: DUPONT ELECTRONICS, INC., Wilmington, DE (US)

(72) Inventors: Christopher Robert Becks, Grove City, OH (US); Rosa Irene Gonzalez, Circleville, OH (US); Thomas D Lantzer, Wake Forest, NC (US); Rajesh Tripathi, Wilmington, DE (US)

(73) Assignee: DUPONT ELECTRONICS, INC.

( * ) Notice: Subject to any disclaimer, the term of this patent is extended or adjusted under 35 U.S.C. 154(b) by 586 days.

(21) Appl. No.: 16/597,298

(22) Filed: Oct. 9, 2019

(65) Prior Publication Data

US 2021/0111097 A1 Apr. 15, 2021

(51) Int. Cl.
| | |
|---|---|
| *H01L 23/373* | (2006.01) |
| *C08G 73/10* | (2006.01) |
| *C09J 7/22* | (2018.01) |
| *C09J 7/24* | (2018.01) |
| *C09J 7/26* | (2018.01) |
| *C09J 7/29* | (2018.01) |
| *H01L 23/14* | (2006.01) |

(52) U.S. Cl.
CPC ...... *H01L 23/3735* (2013.01); *C08G 73/1075* (2013.01); *C09J 7/22* (2018.01); *C09J 7/243* (2018.01); *C09J 7/26* (2018.01); *C09J 7/29* (2018.01); *H01L 23/145* (2013.01)

(58) Field of Classification Search
CPC .............. H01L 23/3735; H01L 23/145; C08G 73/1075; C09J 7/22; C09J 7/243; C09J 7/26; C09J 7/29; B32B 27/08; B32B 2255/06; B32B 2264/10; B32B 15/20; B32B 7/027
See application file for complete search history.

(56) References Cited

U.S. PATENT DOCUMENTS

| | | | |
|---|---|---|---|
| 4,742,099 A | 5/1988 | Nagano et al. | |
| 4,810,563 A | 3/1989 | De Gree et al. | |
| 5,166,308 A | 11/1992 | Kreuz et al. | |
| 5,218,034 A | 6/1993 | Milligan et al. | |
| 5,227,244 A | 7/1993 | Milligan | |
| 5,298,331 A | 3/1994 | Kanakarajan et al. | |
| 5,543,222 A | 8/1996 | Edman et al. | |
| 6,379,784 B1 | 4/2002 | Yamamoto et al. | |
| 7,285,321 B2 | 10/2007 | Kanakarajan et al. | |
| 7,413,815 B2 | 8/2008 | Pramanik | |
| 8,652,622 B2 | 2/2014 | Lu et al. | |
| 9,101,062 B2 | 8/2015 | Aoyagi et al. | |
| 2006/0124693 A1 | 6/2006 | Meloni | |
| 2009/0084423 A1 | 4/2009 | Horio | |
| 2009/0142567 A1 | 6/2009 | Kanakarajan et al. | |
| 2010/0035066 A1* | 2/2010 | Lu ........................... | B32B 27/08 428/458 |
| 2012/0156459 A1* | 6/2012 | Lu ........................... | B32B 15/18 428/216 |
| 2020/0113048 A1* | 4/2020 | Kasai ...................... | B32B 38/10 |

FOREIGN PATENT DOCUMENTS

| | | |
|---|---|---|
| CN | 102825861 A | 12/2012 |
| EP | 0659553 A1 | 6/1995 |
| EP | 1453364 A1 | 9/2004 |
| JP | 2012-213900 A | 11/2012 |
| JP | 2014-177559 A | 9/2014 |
| JP | 2014-183300 A | 9/2014 |
| WO | 2002/021886 A2 | 3/2002 |
| WO | 2008/063730 A2 | 5/2008 |

OTHER PUBLICATIONS

PCT International Search Report for Application No. PCT/US2019/055168; Derek Kelly, Authorized Officer; ISA/EPO; Jan. 10, 2020.

* cited by examiner

*Primary Examiner* — Samir Shah

(57) ABSTRACT

A thermal substrate includes a multilayer film, a first conductive layer adhered to the first outer layer of the multilayer film and a second conductive layer adhered to the second outer layer of the multilayer film. The multilayer film includes a first outer layer including a first thermoplastic polyimide, a core layer including a polyimide and a second outer layer including a second thermoplastic polyimide. The multilayer film has a total thickness in a range of from 5 to 150 μm, and the first outer layer, the core layer and the second outer layer each include a thermally conductive filler. The first conductive layer and the second conductive layer each have a thickness in a range of from 250 to 3000 μm.

10 Claims, No Drawings

THERMAL SUBSTRATES

FIELD OF DISCLOSURE

The field of this disclosure is thermal substrates.

BACKGROUND OF THE DISCLOSURE

In the power electronics industry, electrically insulating layers within a power electronics module are critical for separating circuitry from thermal management layers. Thermal substrates in high power density power electronics packaging are rigid boards on which semiconductor dies can be mounted. In addition to mechanical support, these substrates also provide electrical isolation to the circuit and die, as well as a thermally efficient path for heat dissipation. Power module devices, such as those found in automobiles, manipulate different forms of current and voltages to control equipment and require large currents flowing though their substrates and a high degree of electrical isolation. To achieve the competing needs for both conduction and isolation, thermal substrates take the form of multilayers that include both conducting and insulating layers of dissimilar materials, such as metals (as conductors) and ceramics or polymers (as insulators) and bonding them together in a way that enables a path for heat flow away from the semiconductor die.

The most common structures used for thermal substrates are direct bond copper (DBC) components which are formed through a high temperature bonding process between copper and a highly thermally conductive ceramic, such as $Al_2O_3$, AlN or $Si_3N_4$. In a typical DBC structure, layers of metal and ceramic are bonded together in an environmentally controlled high-temperature process, providing a thermally conducting and electrically insulating ceramic layer between two layers of copper sheet. However, these metal and ceramic layers have large co-efficient of thermal expansion (CTE) differences, and thus the bonding between them experiences large thermomechanical stresses leading to degradation under high temperature gradients during power module operation. In addition, the processes used for bonding copper layers to the ceramic limit the thickness of the copper layers to less than 1000 µm. Typical DBC constructions use 300 µm copper layers and a 380 µm ceramic layer.

Organic-based insulating layers, such as epoxies, have also been commercialized in recent years for relatively lower power devices (i.e., for operating temperatures below 150° C.). For such thermal substrates, the temperature of the device is limited by the chemical and mechanical stability of the organic component. In addition, organic materials must be loaded with thermally conductive fillers to enable acceptable thermal conductivity and are made as thin films to provide a thermal conductivity comparable to ceramic materials. These thin-film epoxies, however, compromise the electrically insulating properties of the thermal substrate.

Polyimide films are used in the manufacture of flexible printed circuit boards due to their good electrical insulating properties, mechanical strength, high temperature stability, and chemical resistance properties. Polyimide films are adhered to thin metal foils to form metal-clad laminates, and find broad usage for die pad bonding of flexible print connection boards, semiconductor devices or packaging materials for chip scale package, chip on flex, chip on lead, lead on chip, multi-chip module, ball grid array (or micro-ball grid array), and/or tape automated bonding, among other applications.

U.S. Pat. No. 7,285,321 describes a multilayer laminate having a low glass transition temperature ($T_g$) polyimide layer, a high $T_g$ polyimide layer, and a conductive layer. The high $T_g$ polyimide layer is a thermoset polyimide and the low $T_g$ polyimide layer is a thermoplastic polyimide. U.S. Pat. No. 6,379,784 describes an aromatic polyimide laminate composed of an aromatic polyimide composite film, a metal film and a release film. The aromatic polyimide composite film is composed of an aromatic polyimide substrate film and two thermoplastic aromatic polyimide layers. The metal film and the release film are adhered to opposite sides of the aromatic polyimide laminate without the use of additional adhesive layers, with good adhesion between the polyimide laminate and the metal film.

Polyimide films can be made thermally conductive through the addition of thermally conductive fillers. European Patent Application No. 0 659 553 A1 describes a method for providing a coextruded multilayer film that can include thermally conductive particles. Inorganic particles of thermally conductive fillers such as BN, $Al_2O_3$, AlN, BeO, ZnO and $Si_3N_4$ or their mixtures can be added in either or both of high and low $T_g$ polyimide layers. Fillers are typically added in the form of a slurry to the cast solution of the polymer. The solvent of the filler based slurry can be same or different from that used to make the polymer cast solution.

SUMMARY

A thermal substrate includes a multilayer film, a first conductive layer adhered to the first outer layer of the multilayer film and a second conductive layer adhered to the second outer layer of the multilayer film. The multilayer film includes a first outer layer including a first thermoplastic polyimide, a core layer including a polyimide and a second outer layer including a second thermoplastic polyimide. The multilayer film has a total thickness in a range of from 5 to 150 µm, and the first outer layer, the core layer and the second outer layer each include a thermally conductive filler. The first conductive layer and the second conductive layer each have a thickness in a range of from 250 to 3000 µm.

The foregoing general description and the following detailed description are exemplary and explanatory only and are not restrictive of the invention, as defined in the appended claims.

DETAILED DESCRIPTION

A thermal substrate includes a multilayer film, a first conductive layer adhered to the first outer layer of the multilayer film and a second conductive layer adhered to the second outer layer of the multilayer film. The multilayer film includes a first outer layer including a first thermoplastic polyimide, a core layer including a polyimide and a second outer layer including a second thermoplastic polyimide. The multilayer film has a total thickness in a range of from 5 to 150 µm, and the first outer layer, the core layer and the second outer layer each include a thermally conductive filler. The first conductive layer and the second conductive layer each have a thickness in a range of from 250 to 3000 µm.

In one embodiment of the thermal substrate, the first outer layer has a thickness in a range of from 1.5 to 20 µm, core layer has a thickness in a range of from 5 to 125 µm and the second outer layer has a thickness in a range of from 1.5 to 20 µm.

In another embodiment of the thermal substrate, a $T_g$ of the core layer is higher than both a $T_g$ of the first outer layer and a $T_g$ of the second outer layer.

In still another embodiment of the thermal substrate, the thermally conductive filler of the first outer layer is present in an amount of from greater than 0 to 50 wt % based on the weight of the dry first outer layer, the thermally conductive filler of the core layer is present in an amount of from greater than 0 to 60 wt % based on the weight of the dry core layer and the thermally conductive filler of the second outer layer is present in an amount of from greater than 0 to 50 wt % based on the weight of the dry second outer layer.

In yet another embodiment of the thermal substrate, a weight percentage of thermally conductive filler in the core layer is higher than that of the first outer layer, the second outer layer, or both the first and second outer layers, based on the dry weight of each layer.

In still yet another embodiment of the thermal substrate, the thermally conductive filler of each of the first outer layer, the core layer and the second outer layer are individually selected from the group consisting of BN, $Al_2O_3$, AlN, SiC, BeO, diamond, $Si_3N_4$ and mixtures thereof.

In a further embodiment of the thermal substrate, the first thermoplastic polyimide includes an aromatic dianhydride selected from the group consisting of 4,4'-oxydiphthalic dianhydride, pyromellitic dianhydride, 3,3',4,4'-biphenyl tetracarboxylic dianhydride, 3,3',4,4'-benzophenone tetracarboxylic dianhydride and mixtures thereof; and an aromatic diamine selected from the group consisting of 1,3-bis(4-aminophenoxy) benzene, 2,2-bis-(4-[4-aminophenoxy]phenyl) propane and mixtures thereof.

In still a further embodiment of the thermal substrate, the second thermoplastic polyimide includes an aromatic dianhydride selected from the group consisting of 4,4'-oxydiphthalic dianhydride, pyromellitic dianhydride, 3,3',4,4'-biphenyl tetracarboxylic dianhydride, 3,3',4,4'-benzophenone tetracarboxylic dianhydride and mixtures thereof; and an aromatic diamine selected from the group consisting of 1,3-bis(4-aminophenxoxy) benzene, hexamethylene diamine and mixtures thereof.

In yet a further embodiment of the thermal substrate, the first thermoplastic polyimide and second thermoplastic polyimide are the same.

In still yet a further embodiment of the thermal substrate, the polyimide of the core layer includes an aromatic dianhydride selected from the group consisting of 3,3',4,4'-biphenyl tetracarboxylic dianhydride, 4,4'-oxydiphthalic dianhydride, pyromellitic dianhydride, 3,3',4,4'-benzophenone tetracarboxylic dianhydride, bisphenol A dianhydride, 1,2,5,6-naphthalene tetracarboxylic dianhydride, 1,4,5,8-naphthalene tetracarboxylic dianhydride, and 2,3,6,7-naphthalene tetracarboxylic dianhydride and mixtures thereof; and an aromatic diamine selected from the group consisting of p-phenylenediamine, 4,4'-diaminodiphenyl ether, 3,4'-diaminodiphenyl ether, 2,2'-bis(trifluoromethyl) benzidine, m-phenylenediamine and 4,4'-diaminodiphenylmethane and mixtures thereof.

In another further embodiment of the thermal substrate, the first thermoplastic polyimide and the second thermoplastic polyimide each have a $T_g$ in the range of from 150 to 320° C.

Many aspects and embodiments have been described above and are merely exemplary and not limiting. After reading this specification, skilled artisans appreciate that other aspects and embodiments are possible without departing from the scope of the invention. Other features and advantages of the invention will be apparent from the following detailed description, and from the claims.

In one embodiment, a core layer for a multilayer film includes a polyimide synthesized by a poly-condensation reaction, involving the reaction of a first aromatic dianhydride with a first aromatic diamine. In one embodiment, the polyimide can include one or more additional aromatic dianhydrides, one or more additional aromatic diamines, or both one or more additional aromatic dianhydrides and one or more additional aromatic diamines. In one embodiment, an aromatic dianhydride can be selected from the group consisting of 3,3',4,4'-biphenyl tetracarboxylic dianhydride, 4,4'-oxydiphthalic dianhydride, pyromellitic dianhydride, 3,3',4,4'-benzophenone tetracarboxylic dianhydride, bisphenol A dianhydride, 1,2,5,6-naphthalene tetracarboxylic dianhydride, 1,4,5,8-naphthalene tetracarboxylic dianhydride, and 2,3,6,7-naphthalene tetracarboxylic dianhydride. In one embodiment, an aromatic diamine can be selected from the group consisting of p-phenylenediamine, 4,4'-diaminodiphenyl ether (ODA), 3,4'-diaminodiphenyl ether, 2,2'-bis (trifluoromethyl) benzidine (TFMB), m-phenylenediamine (MPD) and 4,4'-diaminodiphenylmethane (MDA). In one embodiment, the polyimide can include an aliphatic diamine. In one embodiment, the core layer can be a thermoset polyimide. In one embodiment, the core layer can include a polyimide with some thermoplastic properties.

In one embodiment, a first outer layer for a multilayer film includes a first thermoplastic polyimide. In one embodiment, the first thermoplastic polyimide can be synthesized by a poly-condensation reaction, involving the reaction of an aromatic dianhydride and an aromatic diamine. In one embodiment, the first thermoplastic polyimide can include one or more additional aromatic dianhydrides, one or more additional aromatic diamines, or both additional aromatic dianhydrides and additional aromatic diamines. In one embodiment, a second outer layer for a multilayer film includes a second thermoplastic polyimide. In one embodiment, the second thermoplastic polyimide can be synthesized by a poly-condensation reaction, involving the reaction of an aromatic dianhydride and an aromatic diamine. In one embodiment, the second thermoplastic polyimide can include one or more additional aromatic dianhydrides, one or more additional aromatic diamines, or both additional aromatic dianhydrides and additional aromatic diamines. In on embodiment, the first outer layer, the second outer layer, or both the first and the second outer layers can include one or more aliphatic diamines, which may be useful to lower the $T_g$ of the outer layers, if desired. In one embodiment, the first thermoplastic polyimide and the second thermoplastic polyimide can be the same or different. In one embodiment, the first thermoplastic polyimide and the second thermoplastic polyimide each have a $T_g$ in the range of from about 150 to about 320° C.

As used herein, an "aromatic diamine" is intended to mean a diamine having at least one aromatic ring, either alone (i.e., a substituted or unsubstituted, functionalized or unfunctionalized benzene or similar-type aromatic ring) or connected to another (aromatic or aliphatic) ring, and such an amine is to be deemed aromatic, regardless of any non-aromatic moieties that might also be a component of the diamine. Hence, an aromatic diamine backbone chain segment is intended to mean at least one aromatic moiety between two adjacent imide linkages. As used herein, an "aliphatic diamine" is intended to mean any organic diamine that does not meet the definition of an aromatic diamine.

Depending upon context, "diamine" as used herein is intended to mean: (i) the unreacted form (i.e., a diamine monomer); (ii) a partially reacted form (i.e., the portion or portions of an oligomer or other polyimide precursor derived from or otherwise attributable to diamine monomer) or (iii) a fully reacted form (the portion or portions of the polyimide derived from or otherwise attributable to diamine mono- mer). The diamine can be functionalized with one or more moieties, depending upon the particular embodiment selected in the practice of the present invention.

Indeed, the term "diamine" is not intended to be limiting (or interpreted literally) as to the number of amine moieties in the diamine component. For example, (ii) and (iii) above include polymeric materials that may have two, one, or zero amine moieties. Alternatively, the diamine may be function- alized with additional amine moieties (in addition to the amine moieties at the ends of the monomer that react with dianhydride to propagate a polymeric chain). Such addi- tional amine moieties could be used to crosslink the polymer or to provide other functionality to the polymer.

Similarly, the term "dianhydride" as used herein is intended to mean the component that reacts with (is com- plimentary to) the diamine and in combination is capable of reacting to form an intermediate polyamic acid (which can then be cured into a polyimide). Depending upon context, "anhydride" as used herein can mean not only an anhydride moiety per se, but also a precursor to an anhydride moiety, such as: (i) a pair of carboxylic acid groups (which can be converted to anhydride by a de-watering or similar-type reaction); or (ii) an acid halide (e.g., chloride) ester func- tionality (or any other functionality presently known or developed in the future which is) capable of conversion to anhydride functionality.

Depending upon context, "dianhydride" can mean: (i) the unreacted form (i.e. a dianhydride monomer, whether the anhydride functionality is in a true anhydride form or a precursor anhydride form, as discussed in the prior above paragraph); (ii) a partially reacted form (i.e., the portion or portions of an oligomer or other partially reacted or precur- sor polyimide composition reacted from or otherwise attrib- utable to dianhydride monomer) or (iii) a fully reacted form (the portion or portions of the polyimide derived from or otherwise attributable to dianhydride monomer).

The dianhydride can be functionalized with one or more moieties, depending upon the particular embodiment selected in the practice of the present invention. Indeed, the term "dianhydride" is not intended to be limiting (or inter- preted literally) as to the number of anhydride moieties in the dianhydride component. For example, (i), (ii) and (iii) (in the paragraph above) include organic substances that may have two, one, or zero anhydride moieties, depending upon whether the anhydride is in a precursor state or a reacted state. Alternatively, the dianhydride component may be functionalized with additional anhydride type moieties (in addition to the anhydride moieties that react with diamine to provide a polyimide). Such additional anhydride moieties could be used to crosslink the polymer or to provide other functionality to the polymer.

Although methods and materials similar or equivalent to those described herein can be used in the practice or testing of the present invention, suitable methods and materials are described herein.

When an amount, concentration, or other value or param- eter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

In describing certain polymers, it should be understood that sometimes applicants are referring to the polymers by the monomers used to make them or the amounts of the monomers used to make them. While such a description may not include the specific nomenclature used to describe the final polymer or may not contain product-by-process termi- nology, any such reference to monomers and amounts should be interpreted to mean that the polymer is made from those monomers or that amount of the monomers, and the corresponding polymers and compositions thereof.

The materials, methods, and examples herein are illustra- tive only and, except as specifically stated, are not intended to be limiting.

As used herein, the terms "comprises," "comprising," "includes," "including," "has," "having" or any other varia- tion thereof, are intended to cover a non-exclusive inclusion. For example, a method, process, article, or apparatus that comprises a list of elements is not necessarily limited only those elements but may include other elements not expressly listed or inherent to such method, process, article, or appa- ratus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Organic Solvents

Useful organic solvents for the synthesis of the polyim- ides of the present invention are preferably capable of dissolving the polyimide precursor materials. Such a solvent should also have a relatively low boiling point, such as below 225° C., so the polymer can be dried at moderate (i.e., more convenient and less costly) temperatures. A boiling point of less than 210, 205, 200, 195, 190, or 180° C. is preferred.

Solvents of the present invention may be used alone or in combination with other solvents (i.e., co-solvents). Useful organic solvents include: N-methylpyrrolidone (NMP), dim- ethylacetamide (DMAc), N,N'-dimethyl-formamide (DMF), dimethyl sulfoxide (DMSO), tetramethyl urea (TMU), diethyleneglycol diethyl ether, 1,2-dimethoxyethane (mono- glyme), diethylene glycol dimethyl ether (diglyme), 1,2-bis- (2-methoxyethoxy) ethane (triglyme), bis [2-(2-methoxy- ethoxy) ethyl)] ether (tetraglyme), gamma-butyrolactone, and bis-(2-methoxyethyl) ether, tetrahydrofuran. In one embodiment, preferred solvents include N-methylpyrrroli- done (NMP) and dimethylacetamide (DMAc).

Co-solvents can generally be used at about 5 to 50 weight percent of the total solvent, and useful such co-solvents include xylene, toluene, benzene, "Cellosolve" (glycol ethyl ether), and "Cellosolve acetate" (hydroxyethyl acetate gly- col monoacetate).

Aromatic Diamines

In one embodiment, any number of suitable aromatic diamines can be included in the core layer polyimide, including p-phenylenediamine (PPD), m-phenylenediamine (MPD), 2,5-dimethyl-1,4-diaminobenzene, trifluoromethyl-2,4-diaminobenzene, trifluoromethyl-3,5-diaminobenzene, 2,5-dimethyl-1,4-phenylenediamine (DPX), 2,2-bis-(4-aminophenyl) propane, 4,4'-diaminobiphenyl, 4,4'-diaminobenzophenone, 4,4'-diaminodiphenylmethane (MDA), 4,4'-diaminodiphenyl sulfide, 4,4'-diaminodiphenyl sulfone, 3,3'-diaminodiphenyl sulfone, bis-(4-(4-aminophenoxy)phenyl sulfone (BAPS), 4,4'-bis-(aminophenoxy)biphenyl (BAPB), 4,4'-diaminodiphenyl ether (ODA), 3,4'-diaminodiphenyl ether, 4,4'-diaminobenzophenone, 4,4'-isopropylidenediani-line, 2,2'-bis-(3-aminophenyl)propane, N,N-bis-(4-aminophenyl)-n-butylamine, N,N-bis-(4-aminophenyl) methylamine, 1,5-diaminonaphthalene, 3,3'-dimethyl-4,4'-diaminobiphenyl, m-amino benzoyl-p-amino anilide, 4-aminophenyl-3-aminobenzoate, N,N-bis-(4-aminophenyl) aniline, 2,4-diaminotoluene, 2,5-diaminotoluene, 2,6-diaminotoluene, 2,4-diamine-5-chlorotoluene, 2,4-diamine-6-chlorotoluene, 2,4-bis-(beta-amino-t-butyl) toluene, bis-(p-beta-amino-t-butyl phenyl) ether, p-bis-2-(2-methyl-4-aminopentyl) benzene, m-xylylene diamine, and p-xylylene diamine.

Other useful aromatic diamines include 2,2'-bis(trifluoromethyl) benzidine (TFMB), 1,2-bis-(4-aminophenoxy) benzene, 1,3-bis-(4-aminophenoxy) benzene, 1,2-bis-(3-aminophenoxy)benzene, 1,3-bis-(3-aminophenoxy) benzene, 1-(4-aminophenoxy)-3-(3-aminophenoxy) benzene, 1,4-bis-(4-aminophenoxy) benzene, 1,4-bis-(3-aminophenoxy) benzene, 1-(4-aminophenoxy)-4-(3-aminophenoxy) benzene, 2,2-bis-(4-[4-aminophenoxy]phenyl) propane (BAPP), 2,2'-bis-(4-aminophenyl)-hexafluoro propane (6F diamine), 2,2'-bis-(4-phenoxy aniline) isopropylidene, 2,4,6-trimethyl-1,3-diaminobenzene, 4,4'-diamino-2,2'-trifluoromethyl diphenyloxide, 3,3'-diamino-5,5'-trifluoromethyl diphenyloxide, 4,4'-trifluoromethyl-2,2'-diaminobiphenyl, 2,4,6-trimethyl-1,3-diaminobenzene, 4,4'-oxy-bis-[2-trifluoromethyl)benzene amine] (1,2,4-OBABTF), 4,4'-oxy-bis-[3-trifluoromethyl)benzene amine], 4,4'-thio-bis-[(2-trifluoromethyl)benzene-amine], 4,4'-thio-bis[(3-trifluoromethyl)benzene amine], 4,4'-sulfoxyl-bis-[(2-trifluoromethyl)benzene amine, 4,4'-sulfoxyl-bis-[(3-trifluoromethyl)benzene amine], and 4,4'-keto-bis-[(2-trifluoromethyl)benzene amine].

In one embodiment, useful aromatic diamines include the isomers of bis-aminophenoxybenzenes (APB), aminophenoxyphenylpropane (BAPP), dimethylphenylenediamine (DPX), bisaniline P, and combinations thereof, and the use of these particular aromatic diamines can lower the lamination temperature of the polyimide, and can increase the peel strength of the polyimide when adhered to other materials, especially metals.

In one embodiment, the thermoplastic polyimide of the outer layers can include one or more of any of the aromatic diamines listed above for the core layer.

Aromatic Dianhydrides

In one embodiment, any aromatic dianhydride, or combination of aromatic dianhydrides, can be used as dianhydride monomers in forming the core layer polyimide. The dianhydrides can be used in their tetra-acid form (or as mono, di, tri, or tetra esters of the tetra acid), or as their diester acid halides (chlorides). However, in some embodiments, the dianhydride form can be preferred, because it is generally more reactive than the acid or the ester.

Examples of suitable aromatic dianhydrides include 3,3', 4,4'-biphenyl tetracarboxylic dianhydride (BPDA), 1,2,5,6-naphthalene tetracarboxylic dianhydride, 1,4,5,8-naphthalene tetracarboxylic dianhydride, 2,3,6,7-naphthalene tetracarboxylic dianhydride, 2-(3',4'-dicarboxyphenyl) 5,6-dicarboxybenzimidazole dianhydride, 2-(3',4'-dicarboxyphenyl) 5,6-dicarboxybenzoxazole dianhydride, 2-(3',4'-dicarboxyphenyl) 5,6-dicarboxybenzothiazole dianhydride, 2,2',3,3'-benzophenone tetracarboxylic dianhydride, 2,3,3', 4'-benzophenone tetracarboxylic dianhydride, 3,3',4,4'-benzophenone tetracarboxylic dianhydride (BTDA), 2,2',3,3'-biphenyl tetracarboxylic dianhydride, 2,3,3',4'-biphenyl tetracarboxylic dianhydride, bicyclo-[2,2,2]-octen-(7)-2,3,5, 6-tetracarboxylic-2,3,5,6-dianhydride, 4,4'-thio-diphthalic anhydride, bis (3,4-dicarboxyphenyl) sulfone dianhydride, bis (3,4-dicarboxyphenyl) sulfoxide dianhydride (DSDA), bis (3,4-dicarboxyphenyl oxadiazole-1,3,4) p-phenylene dianhydride, bis (3,4-dicarboxyphenyl) 2,5-oxadiazole 1,3, 4-dianhydride, bis 2,5-(3',4'-dicarboxydiphenylether) 1,3,4-oxadiazole dianhydride, 4,4'-oxydiphthalic anhydride (ODPA), bis (3,4-dicarboxyphenyl) thio ether dianhydride, bisphenol A dianhydride (BPADA), bisphenol S dianhydride, 2,2-bis-(3,4-dicarboxyphenyl) 1,1,1,3,3,3-hexafluoropropane dianhydride (6FDA), 5,5-[2,2,2]-trifluoro-1-(trifluoromethyl)ethylidene, bis-1,3-isobenzofurandione, 1,4-bis(4,4'-oxyphthalic anhydride) benzene, bis (3,4-dicarboxyphenyl) methane dianhydride, cyclopentadienyl tetracarboxylic acid dianhydride, cyclopentane tetracarboxylic dianhydride, ethylene tetracarboxylic acid dianhydride, perylene 3,4,9,10-tetracarboxylic dianhydride, pyromellitic dianhydride (PMDA), tetrahydrofuran tetracarboxylic dianhydride, 1,3-bis-(4,4'-oxydiphthalic anhydride) benzene, 2,2-bis(3,4-dicarboxyphenyl) propane dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-1,8,9,10-tetracarboxylic dianhydride, pyrazine-2,3,5,6-tetracarboxylic dianhydride, benzene-1,2,3,4-tetracarboxylic dianhydride; and thiophene-2, 3,4,5-tetracarboxylic dianhydride.

In one embodiment, the thermoplastic polyimide of the outer layers can include one or more of any of the aromatic dianhydrides listed above for the core layer.

Thermally Conductive Filler

In one embodiment, thermally conductive fillers, while being thermally conducting, must also be electrically insulating to preserve the electrically insulating nature of the multilayer film. Example of fillers that are both thermally conducting and electrically insulating include BN, AlN, $Al_2O_3$, $Si_3N_4$, ZnO, $MgCO_3$, MgO, BeO, diamond, SiC, many other oxide, nitride and carbide compounds and mixtures thereof. In one embodiment, a core-shell type filler can include one of these filler materials coated by a coating of a second filler material. These thermally conductive fillers can be of any shape or size and can have an average primary particle size ($D_{50}$) in a range of from about 0.001 to about 8 μm.

Multilayer Films

Polyimide film layers according to the present invention can be produced by combining the diamine and dianhydride (monomer or other polyimide precursor form) together with a solvent to form a polyamic acid (also called a polyamide acid) solution. The dianhydride and diamine can be combined in a molar ratio of about 0.90 to 1.10. The molecular weight of the polyamic acid formed therefrom can be adjusted by adjusting the molar ratio of the dianhydride and diamine.

In one embodiment, a polyamic acid casting solution is derived from the polyamic acid solution. The polyamic acid casting solution, preferably comprising the polyamic acid solution, can optionally be combined with conversion chemicals like: i.) one or more dehydrating agents, such as, aliphatic acid anhydrides (acetic anhydride, etc.) and/or aromatic acid anhydrides; and ii.) one or more catalysts, such as, aliphatic tertiary amines (triethyl amine, etc.), aromatic tertiary amines (dimethyl aniline, etc.) and heterocyclic tertiary amines (pyridine, picoline, isoquinoline, etc.). The anhydride dehydrating material it is often used in molar excess compared to the amount of amide acid groups in the polyamic acid. The amount of acetic anhydride used is typically about 2.0 to 4.0 moles per equivalent (repeat unit) of polyamic acid. Generally, a comparable amount of tertiary amine catalyst is used.

In one embodiment, the polyamic acid solution, and/or the polyamic acid casting solution, is dissolved in an organic solvent at a concentration from about 5.0 or 10% to about 15, 20, 25, 30, 35 and 40% by weight.

In one embodiment, a thermally conductive filler is dispersed or suspended in a polar, aprotic solvent, such as, DMAC or other solvent compatible with polyamic acid. In one embodiment, the thermally conductive filler can be dispersed in an organic solvent at a concentration from about 5, 10 or 15% to about 20, 30, 40, 50 and 75% by weight. In one embodiment, the solvent used for the dispersion or suspension of the thermally conductive filler is the same or different as the solvent used for the polyamic acid solution. The dispersion or suspension of thermally conductive filler can then be added to the polyamic acid casting solution to achieve the desired filler loading of the final film. In one embodiment, the first outer layer can contain thermally conductive filler in an amount of from greater than 0 to about 50 wt % of the dry film. In one embodiment, the core layer can contain thermally conductive filler in an amount of from greater than 0 to about 60 wt % of the dry film. In one embodiment, the second outer layer can contain thermally conductive filler in an amount of from greater than 0 to about 50 wt % of the dry film. In one embodiment, the first outer layer, the core layer and the second outer layer can each have the same or different amount of thermally conductive filler, based on weight percentage of the dry film, as the other layers in the multilayer film. In one embodiment, the weight percentage of thermally conductive filler in the core layer can be higher than that of the first outer layer, the second outer layer, or both the first and second outer layers. In another embodiment, the weight percentage of thermally conductive filler in the core layer can be lower than that of the first outer layer, the second outer layer, or both the first and second outer layers.

The solvated mixture (the polyamic acid casting solution with thermally conductive filler) can then be cast or applied onto a support, such as an endless belt or rotating drum, to give a film. Next, the solvent containing-film can be converted into a self-supporting film by heating at an appropriate temperature (thermal curing) together with conversion chemical reactants (chemical curing). The film can then be separated from the support, oriented such as by tentering, with continued thermal and chemical curing to provide a polyimide film.

Useful methods for producing polyimide film in accordance with the present invention can be found in U.S. Pat. Nos. 5,166,308 and 5,298,331, which are incorporate by reference into this specification for all teachings therein. Numerous variations are also possible, such as, (a.) A method wherein the diamine components and dianhydride components are preliminarily mixed together and then the mixture is added in portions to a solvent while stirring.

(b.) A method wherein a solvent is added to a stirring mixture of diamine and dianhydride components. (contrary to (a) above)

(c.) A method wherein diamines are exclusively dissolved in a solvent and then dianhydrides are added thereto at such a ratio as allowing to control the reaction rate.

(d.) A method wherein the dianhydride components are exclusively dissolved in a solvent and then amine components are added thereto at such a ratio to allow control of the reaction rate.

(e.) A method wherein the diamine components and the dianhydride components are separately dissolved in solvents and then these solutions are mixed in a reactor.

(f.) A method wherein the polyamic acid with excessive amine component and another polyamic acid with excessive dianhydride component are preliminarily formed and then reacted with each other in a reactor, particularly in such a way as to create a non-random or block copolymer.

(g.) A method wherein a specific portion of the amine components and the dianhydride components are first reacted and then the residual diamine components are reacted, or vice versa.

(h.) A method wherein the conversion chemicals are mixed with the polyamic acid to form a polyamic acid casting solution and then cast to form a gel film.

(i.) A method wherein the components are added in part or in whole in any order to either part or whole of the solvent, also where part or all of any component can be added as a solution in part or all of the solvent.

(j.) A method of first reacting one of the dianhydride components with one of the diamine components giving a first polyamic acid. Then reacting the other dianhydride component with the other amine component to give a second polyamic acid. Then combining the amic acids in any one of a number of ways prior to film formation.

The thickness of each polyimide layer may be adjusted, depending on the intended purpose of the film or final application specifications. In one embodiment, the multilayer film has a total thickness of from about 5 to about 150 μm, or from about 15 to about 100 μm, or from about 25 to about 75 μm. In one embodiment, the thickness of the core layer is in a range of from about 5 to about 125 μm, or from about 10 to about 100 μm, or from about 15 to about 75 μm, or from about 15 to about 40 μm. In one embodiment, the thickness of the outer layers is in a range of from about 1.5 to about 20 μm for each of the outer layers, or from about 3 to about 15 μm, or from about 3 to about 12 μm, or from about 3 to about 6 μm for each of the outer layers. Those skilled in the art will appreciate that a minimum thickness of the outer layers with thermoplastic polyimide is needed to provide sufficient adhesion to metal layers to form a useful thermal substrate for power electronics applications. In addition, a minimum thickness of the core layer is needed to maintain the mechanical integrity of the multilayer film.

As a thermal substrate for high power density semiconductor devices (such as insulated gate bipolar transistors), the multilayer film might experience rapid temperature changes from room temperature to temperature as high as 200° C. Actual drive cycle condition of a power module in an automobile might exert these temperature changes in a fast and repeating pattern requiring quick heat dissipation and high mechanical integrity. Under these conditions, a low $T_g$ organic layer, such as an epoxy, is susceptible to adhesion loss and delamination.

In one embodiment, the core layer and the outer layers of the multilayer film can be simultaneously solution cast by co-extrusion. At the time of casting, the polyimides can be in the form of a polyamic acid solution. The cast solutions form an uncured polyamic acid film that is later cured to a polyimide. The adhesion strength of such laminates can be improved by employing various techniques for elevating adhesion strength.

In some embodiments, a finished polyamic acid solution is filtered and pumped to a slot die, where the flow is divided in such a manner as to form the first outer layer and the second outer layer of a three-layer coextruded film. In some embodiments, a second stream of polyimide is filtered, then pumped to a casting die, in such a manner as to form the middle polyimide core layer of a three-layer coextruded film. The flow rates of the solutions can be adjusted to achieve the desired layer thickness.

In some embodiments, the multilayer film is prepared by simultaneously extruding the first outer layer, the core layer and the second outer layer. In some embodiments, the layers are extruded through a single or multi-cavity extrusion die. In another embodiment, the multilayer film is produced using a single-cavity die. If a single-cavity die is used, the laminar flow of the streams should be of high enough viscosity to prevent comingling of the streams and to provide even layering. By using a co-extrusion process, a multilayer film with good interlayer adhesion can be made without the use of adhesives layers.

In one embodiment, the multilayer film can be formed by any conventional technique used in the formation of poly-imide films. In one embodiment, the outer layers can be applied to the core layer during an intermediate manufacturing stage of making polyimide film such as to gel film or to green film.

Thermal Substrates

In one embodiment, a lamination process may be used to form a thermal substrate with a multilayer film adhered to first and second conductive layers. In one embodiment, a first outer layer of the multilayer film, including a first thermoplastic polyimide, is between a first conductive layer and a core layer of the multilayer film, and a second outer layer, including a second thermoplastic polyimide, is on the opposite side of the core layer. In one embodiment, a second conductive layer is placed in contact with the second outer layer on a side opposite the core layer. One advantage of this type of construction is that the lamination temperature of the multilayer film is lowered to the lamination temperature necessary for the thermoplastic polyimide of the outer layer to bond to a conductive layer(s). In one embodiment, the conductive layer(s) is a metal layer(s). In one embodiment, a metal layer is a metal sheet having a thickness in a range of from about 250 to about 3000 μm, or from about 250 to about 2000 μm, or from about 300 to about 1000 μm.

In one embodiment, prior to the step of applying the multilayer film of the present invention onto a conductive layer, the polyimide film can be subjected to a pre-treatment step. Pre-treatment steps can include, heat treatment, corona treatment, plasma treatment under atmospheric pressure, plasma treatment under reduced pressure, treatment with coupling agents like silanes and titanates, sandblasting, alkali-treatment, acid-treatments, and coating polyamic acids. To improve the adhesion strength, it is generally also possible to add various metal compounds as disclosed in U.S. Pat. Nos. 4,742,099; 5,227,244; 5,218,034; and 5,543, 222, incorporated herein by reference.

In addition, (for purposes of improving adhesion) the conductive layer surface may be treated with various organic and inorganic treatments. These treatments include using silanes, imidazoles, triazoles, oxide and reduced oxide treatments, tin oxide treatment, and surface cleaning/roughening (called micro-etching) via acid or alkaline reagents.

As used herein, the term "conductive layers" mean metal layers (compositions having at least 50% of the electrical conductivity of a high-grade copper). Metal layers do not have to be used as elements in pure form; they may also be used as metal alloys, such as copper alloys containing nickel, chromium, iron, and other metals.

Particularly suitable metal layers are rolled, annealed copper or rolled, annealed copper alloy. In many cases, it has proved to be advantageous to pre-treat the metallic layer before adhering the multilayer film. This pre-treatment may include, but is not limited to, electro-deposition or immersion-deposition on the metal of a thin layer of copper, zinc, chrome, tin, nickel, cobalt, other metals, and alloys of these metals. The pre-treatment may consist of a chemical treatment or a mechanical roughening treatment.

In one embodiment, an organic direct bond copper (ODBC) system can include the multilayer film and a first copper layer adhered to an outer surface of the first outer layer of the multilayer film. In one embodiment, a ODBC system can include a second copper layer adhered to an outer surface of the second outer layer of the multilayer film. In one embodiment, the first copper layer and the second copper layer are the same thickness. In a specific embodiment, the first copper layer and the second copper layer are the same thickness and are in a range of from about 300 μm to about 1000 μm thick. In one embodiment, the first copper layer is thicker than the second copper layer. In a specific embodiment, the first copper layer is 500 μm thick and the second copper layer is 2000 μm thick. In one embodiment, an outer layer of the first copper layer includes microchannels. These microchannels can provide improved heat dissipation for the thermal substrate.

In one embodiment, the copper layers can be laminated to the multilayer film using a static press or autoclave, as conventionally used to form metal-clad laminates with polyimide films for flex circuit applications. An ODBC structure using the multilayer film and conductive layers of the present invention maintains good adhesion strength due to the thermoplastic nature of the outer layers of the multilayer film, and thus the effects of CTE mismatch are minimized. This contrasts with ceramic-metal bonding in DBC structures, in which bond rigidity in combination with the CTE difference between the ceramic and metal results in large thermomechanical stresses during power module operation. As a result, ODBC thermal substrates using the multilayer film and conductive layers of the present invention can be used for high power density power electronics packaging, operating at temperatures of up to 200° C.

In addition, the polyimide films of the present invention generally also have a low loss-tangent value. Loss-tangent is typically measured at 10 GHz and is used to measure a dielectric material's degradation of a nearby digital signal that is passing through a metal circuit trace. Different loss-tangent values exist for different dielectric materials. The lower the loss-tangent value for a given dielectric material, the (increasingly) superior a material is for digital circuitry applications. The polyimides of the present invention exhibit excellent, low loss-tangent values. In one embodiment, the loss-tangent value for the polyimide layers was less than 0.010, about 0.004, at 10 GHz. The polyimides of present invention may also be used in applications ranging from 1 to 100 GHz, with 1 to 20 GHz being most common.

The multilayer films of the present invention exhibit excellent attenuation. The polyimides of the present invention can often exhibit an attenuation value, measured in decibels per inch, of about 0.3 at 10 GHz using a 50-ohm micro strip.

In one embodiment, a polyimide precursor for a core layer and polyimide precursors for first and second outer layers are cast simultaneously (using a multi-port die) to form a multilayer polyimide film (after curing of the polyamic acid layers). This multilayer film is then bonded to metal layer(s) using the thermoplastic polyimide of the outer layer(s) as the bonding layer to the metal layer(s). Thus, a thermal substrate formed comprises the multilayer film and at least one conductive layer.

The advantageous properties of this invention can be observed by reference to the following examples that illustrate, but do not limit, the invention. All parts and percentages are by weight unless otherwise indicated.

EXAMPLES

Polyamic acid solutions for producing the core layer and outer layers were separately prepared by a chemical reaction between the appropriate molar equivalents of the monomers in dimethylacetamide (DMAc) solvent. Typically, the diamine dissolved in DMAc was stirred under nitrogen, and the dianhydride was added as a solid over a period of several minutes. Stirring was continued to obtain maximum viscosity of the polyamic acid. The viscosity was adjusted by controlling the amount of dianhydride in the polyamic acid composition.

For the thermally conductive filler, a 25 wt % dispersion of BN in DMAc was made and then added to the polyamic acid solutions so that the multilayer film would have 50 wt % BN in the core layer and 25 wt % BN in the outer layers of the dried film.

Multilayer films were cast by co-extrusion. Three separate polyamic polymer streams were simultaneously extruded through a multi-cavity extrusion die onto a heated moving belt to form a co-extruded three-layer polyimide film. The thicknesses of the polyimide core layer and the top and bottom thermoplastic polyimide outer layers were adjusted by varying the amounts of polyamic acids fed to the extruder.

The extruded multilayer film was dried at an oven temperature in the range of from about 95 to about 150° C. The self-supporting film was peeled from the belt and heated with radiant heaters in a tenter oven at a temperature of from about 110 to about 805° C. (radiant heater surface temperature) to completely dry and imidize the polymers.

The radiant heating set point temperature used to cure the film was 805° C. The core layer polymer composition contained a polyimide derived from an approximately 1:1 molar ratio of PMDA to ODA.

The thermoplastic outer layers also contained a polyimide derived from an approximately 1:1 molar ratio of dianhydride to diamine. The dianhydride composition contained the monomers PMDA and ODPA in a 20:80 molar ratio and the diamine composition was 100 mole % RODA monomer. The flow rates of the polyamic acid solutions were adjusted to yield a three-layer film in which the thermoplastic outer layers were approximately 3 μm thick, and the core layer was approximately 19 μm thick.

A cross sectional scanning electron microscope (SEM) image of the three-layer film was obtained to determine the thicknesses of the multilayer film and the individual core and outer layers. To obtain this image, a film sample was cut and mounted in an epoxy and allowed to dry overnight. The sample was then polished using a Buehler variable speed grinder/polisher and placed into a desiccator for about two hours to ensure dryness. The image was captured using a Hitachi S-3400 SEM (Hitachi High Technologies America, Inc., Schaumburg, IL) under variable pressure. The total thickness of the multilayer film was approximately 25 μm.

The multilayer film was used to prepare a series of ODBC thermal substrates. 1000 μm copper sheet was laminated to both sides of the multilayer film using a vacuum assisted static press at temperatures with a maximum temperature of 330° C. The substrates were evaluated for thermal and reliability performance by conducting inspections periodically during accelerated testing.

For thermal shock testing, several substrates were placed in a thermal shock chamber and cycled between temperature extremes of −40° C. and 200° C. Substrates were inspected every 1000 cycles. After 5000 cycles, the ODBC substrates experienced no high potential (hipot) failures, but preliminary edge delamination was visually observed.

For thermal aging, a separate set of samples were placed in a thermal chamber and subjected to an elevated temperature of 175° C. After 1100 hours, no hipot failures were observed, but edge delamination was again observed.

Another set of samples were attached to a cold plate with Kapton® tape to test for power cycling. Heater cartridges were attached to the top of the substrates with Kapton® tape and thermocouples were placed in several locations through the package. The heater cartridges were alternated between on and off states to allow for the substrates to cycle between 40° C. and 200° C. While the change between the maximum and minimum temperatures is smaller for the power cycling test compared to the thermal cycling test, the heater cartridge and cold plate create a thermal gradient within the samples that is not possible with passive thermal cycling. After 700 hours/1300 cycles of testing, no hipot failures or edge delamination were observed.

Any change in thermal performance of the package was measured by a transient thermal tester. A diode in a TO-247 package was attached to the top of the substrate under test with thermal grease. The thermal grease also adhered the substrate to a cold plate. A transient power pulse was applied to the package, and the decay of the temperature in the diode was monitored over time. This, coupled with transient 1D conduction analysis, helps establish the resistance-capacitance network for the package. The resistance measurements were monitored for any changes between a new substrate and a substrate that had completed an accelerated test. Thermal resistance measurements, as shown in Table 1, demonstrate that the ODBC substrates show good stability in all three of the accelerated tests.

TABLE 1

| Substrate Condition | Initial | Thermal Aging | Power Cycling | Thermal Shock |
|---|---|---|---|---|
| Thermal Resistance (K/W) | 4.15 | 4.26 | 4.22 | 4.31 |

Acoustic imaging of the ODBC substrates show that the bonded area between the multilayer film and the copper sheets is uniform and free of defects, although slight edge delamination is observed.

Note that not all of the activities described above in the general description are required, that a portion of a specific activity may not be required, and that further activities may be performed in addition to those described. Still further, the order in which each of the activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that various modifications and changes can be made without departing from the scope of the invention as set forth in the claims below. All features disclosed in this specification may be replaced by alternative features serving the same, equivalent or similar purpose.

Accordingly, the specification and figures are to be regarded in an illustrative rather than a restrictive sense and all such modifications are intended to be included within the scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

When an amount, concentration, or other value or parameter is given as either a range, preferred range or a list of upper values and lower values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

What is claimed is:

1. A thermal substrate comprising:
a multilayer film comprising:
  a first outer layer comprising a first thermoplastic polyimide;
  a core layer comprising a polyimide; and
  a second outer layer comprising a second thermoplastic polyimide, wherein:
    the thicknesses of the first and second outer layers are each in a range of from 3 to 6 μm; wherein a glass transition temperature ($T_g$) of the core layer is higher than both a $T_g$ of the first outer layer and a $T_g$ of the second outer layer;
    the multilayer film has a total thickness in a range of from 15 to 100 μm; and
    the first outer layer, the core layer and the second outer layer each comprise a thermally conductive filler; wherein the thermally conductive filler of each of the first outer layer, the core layer and the second outer layer are individually selected from the group consisting of BN, $Al_2O_3$, AlN, SiC, BeO, diamond, $Si_3N_4$ and mixtures thereof;
a first conductive layer adhered to the first outer layer of the multilayer film; and
a second conductive layer adhered to the second outer layer of the multilayer film, wherein the first conductive layer and the second conductive layer each comprise a metal sheet and have a thickness in a range of from 250 to 3000 μm.

2. The thermal substrate of claim 1, wherein:
the thermally conductive filler of the first outer layer is present in an amount of from greater than 0 to 50 wt % based on the weight of the dry first outer layer;
the thermally conductive filler of the core layer is present in an amount of from greater than 0 to 60 wt % based on the weight of the dry core layer; and
the thermally conductive filler of the second outer layer is present in an amount of from greater than 0 to 50 wt % based on the weight of the dry second outer layer.

3. The thermal substrate of claim 1, wherein a weight percentage of thermally conductive filler in the core layer is higher than that of the first outer layer, the second outer layer, or both the first and second outer layers, based on the dry weight of each layer.

4. The thermal substrate of claim 1, wherein the first thermoplastic polyimide comprises:
an aromatic dianhydride selected from the group consisting of 4,4'-oxydiphthalic dianhydride, pyromellitic dianhydride, 3,3',4,4'-biphenyl tetracarboxylic dianhydride, 3,3',4,4'-benzophenone tetracarboxylic dianhydride and mixtures thereof; and
an aromatic diamine selected from the group consisting of 1,3-bis(4-aminophenoxy) benzene, 2,2-bis-(4-[4-aminophenoxy]phenyl) propane and mixtures thereof.

5. The thermal substrate of claim 1, wherein the second thermoplastic polyimide comprises:
an aromatic dianhydride selected from the group consisting of 4,4'-oxydiphthalic dianhydride, pyromellitic dianhydride, 3,3',4,4'-biphenyl tetracarboxylic dianhydride, 3,3',4,4'-benzophenone tetracarboxylic dianhydride and mixtures thereof; and
an aromatic diamine selected from the group consisting of 1,3-bis(4-aminophenoxy) benzene, hexamethylene diamine and mixtures thereof.

6. The thermal substrate of claim 1, wherein the first thermoplastic polyimide and second thermoplastic polyimide are the same.

7. The thermal substrate of claim 1, wherein the polyimide of the core layer comprises:
an aromatic dianhydride selected from the group consisting of 3,3',4,4'-biphenyl tetracarboxylic dianhydride, 4,4'-oxydiphthalic dianhydride, pyromellitic dianhydride, 3,3',4,4'-benzophenone tetracarboxylic dianhydride, bisphenol A dianhydride, 1,2,5,6-naphthalene tetracarboxylic dianhydride, 1,4,5,8-naphthalene tetracarboxylic dianhydride, and 2,3,6,7-naphthalene tetracarboxylic dianhydride and mixtures thereof; and
an aromatic diamine selected from the group consisting of p-phenylenediamine, 4,4'-diaminodiphenyl ether, 3,4'-diaminodiphenyl ether, 2,2'-bis(trifluoromethyl) benzidine, m-phenylenediamine and 4,4'-diaminodiphenylmethane and mixtures thereof.

8. The thermal substrate of claim 1, wherein the first thermoplastic polyimide and the second thermoplastic polyimide each have a $T_g$ in the range of from 150 to 320° C.

9. The thermal substrate of claim 1, wherein the thermal substrate operates at temperatures of up to 200° C.

10. The thermal substrate of claim 1, wherein the polyimides of the outer layers and the core layer have a loss-tangent value of less than 0.010 at 10 GHz.

* * * * *